(12) United States Patent
Nishimura et al.

(10) Patent No.: US 6,686,870 B2
(45) Date of Patent: Feb. 3, 2004

(54) RADAR

(75) Inventors: Tetsu Nishimura, Nagaokakyo (JP);
Motoi Nakanishi, Nagaokakyo (JP);
Toru Ishii, Hirakata (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/356,476

(22) Filed: Feb. 3, 2003

(65) Prior Publication Data

US 2003/0151544 A1 Aug. 14, 2003

(30) Foreign Application Priority Data

Feb. 14, 2002 (JP) ........................................ 2002-037092

(51) Int. Cl.$^7$ ................................................ G01S 7/28
(52) U.S. Cl. ...................... 342/70; 342/192; 342/196; 342/109; 342/128
(58) Field of Search ............................ 342/70, 84, 109, 342/111, 128, 129, 135, 174, 192, 196

(56) References Cited

U.S. PATENT DOCUMENTS

| | | | | |
|---|---|---|---|---|
| 5,563,602 A | * | 10/1996 | Stove | 342/70 |
| 5,619,208 A | * | 4/1997 | Tamatsu et al. | 342/70 |
| 5,751,240 A | * | 5/1998 | Fujita et al. | 342/70 |
| 5,757,307 A | * | 5/1998 | Nakatani et al. | 342/70 |
| 6,018,309 A | * | 1/2000 | Mitsumoto et al. | 342/109 |
| 6,198,426 B1 | * | 3/2001 | Tamatsu et al. | 342/70 |
| 2003/0102998 A1 | * | 6/2003 | Ishii et al. | 342/70 |
| 2003/0151543 A1 | * | 8/2003 | Nakanishi et al. | 342/70 |
| 2003/0156055 A1 | * | 8/2003 | Tamatsu et al. | 342/70 |

FOREIGN PATENT DOCUMENTS

| | | |
|---|---|---|
| JP | 07-128440 | 5/1995 |
| JP | 10-213613 | 8/1998 |
| JP | 2001-042033 | 2/2001 |

OTHER PUBLICATIONS

"Nonlinearity compensation circuit for voltage–controlled oscillator operating in linear frequency sweep mode", Kang, B.K.; Kwo H.J.; Mheen, B.K.; Yoo, H.J.; Kim, Y.H.; Microwave and Guided Wave Letters, IEEE, vol.: 10 Issue: 12, Dec. 2000 Ps: 537–539.*

\* cited by examiner

Primary Examiner—John B. Sotomayor
(74) Attorney, Agent, or Firm—Keating & Bennett, LLP

(57) ABSTRACT

A radar device precisely detects a target in short time intervals by detecting a true peak frequency with high accuracy via a calculation which does not require a large amount of computation. A discrete frequency spectrum of a beat signal multiplied by a window function is determined, and values of signal strength at two discrete frequencies which are, respectively, higher and lower than a peak frequency of the discrete frequency spectrum of the beat signal and which are adjacent to the peak frequency. The frequency difference between the discrete peak frequency of the beat signal and the peak frequency of the window function is then determined from the ratio between the values of signal strength at those two discrete frequencies adjacent to the peak frequency. Thus, the true peak frequency of the beat signal is determined with a high frequency resolution.

19 Claims, 10 Drawing Sheets

RADAR

BACKGROUND OF THE INVENTION

1. Field of the Invention

The present invention relates to a radar device for detecting a target by using a radio wave.

2. Description of the Related Art

An FM-CW radar system is known as a radar system which is installed on a moving object, such as a vehicle, to detect a target, such as another vehicle, a human being, or an obstacle.

The FM-CW radar transmits a frequency-modulated continuous transmission signal and receives a reflected signal from a target. The received signal and the transmission signal are mixed to generate a beat signal thereof. The relative speed and the relative distance of the target are then determined from the beat signal.

The frequency of the beat signal is determined as follows. First, a window function is applied to the beat signal, and the resultant signal is subjected to a FFT process to determine the frequency spectrum of the beat signal. FIG. 8A shows an example of a beat signal in the time domain, and FIG. 8B shows an example of a signal in the time domain which is obtained by applying the window function to the original beat signal. FIG. 8C shows the frequency spectrum of the signal shown in FIG. 8B. In the frequency spectrum, a portion having increased signal strength (power) includes main frequency components of the beat signal. The frequency of the peak of that portion corresponds to the frequency of the beat signal (hereinafter, such a frequency will be referred to simply as a peak frequency).

However, the spectrum obtained via the discrete Fourier transform, such as FFT, is a discrete spectrum including components at frequency intervals equal to 1/T where T is the sampling interval. This means that, in the detection of the peak frequency of the beat signal, the highest possible frequency resolution is determined by the frequency interval (FFT range bin) equal to 1/T. Hereinafter, the frequency of a discrete frequency spectrum component having the highest signal strength will be referred to as the discrete peak frequency.

In such a radar device, techniques which improve the peak frequency resolution are disclosed in the following patent related documents: (1) Japanese Patent No. 3213143; (2) Japanese Unexamined Patent Application Publication No. 2001-42033; and (3) Japanese Unexamined Patent Application Publication No. 10-213613.

In the radar device disclosed in (1), the barycenter of the signal strength (power) is determined from data indicating a discrete frequency spectrum, and the barycentric frequency is used as the peak frequency. FIGS. 9A to 9C show a process of determining the peak frequency according to the above-identified method. More specifically, FIG. 9A shows an example of a beat signal in the time domain, and FIG. 9B shows an example of a signal in the time domain, obtained by applying a window function to the original beat signal shown in FIG. 9A. FIG. 9C shows the frequency spectrum of the signal shown in FIG. 9B. As shown FIG. 9C, the frequency at the barycenter of a portion including increased spectrum components is detected as the peak frequency.

In the radar device disclosed in (2), after applying a window function to a beat signal, the amount of data is increased by adding data with an amplitude of zero, and the result is subjected to a discrete Fourier transform. FIGS. 10A to 10C show a process according to the above-identified method. More specifically, FIG. 10A shows an example of a beat signal in the time domain, and FIG. 10B shows a signal in the time domain, obtained by adding data having an amplitude of zero after applying a window function to the beat signal shown in FIG. 10A. FIG. 10C shows the frequency spectrum of the signal shown in FIG. 10B. As shown in FIG. 10C, the resultant spectrum has a greater number of components obtained by interpolation, such that the peak frequency is detected with a higher detection resolution.

In the radar device disclosed in (3), the difference between the frequency of a true peak point and the frequency of a discrete frequency spectrum component having the greatest signal strength is determined from the ratios of the components having the greatest signal strength to the signal strength of higher and lower spectrum components adjacent to the component having the greatest signal strength.

However, in radar devices using any of the techniques disclosed in (1), (2), or (3), a great amount of computation is needed to detect the true peak frequency. That is, to determine the peak frequency with high accuracy, sampling must be performed at very short intervals, and thus, a very high performance processor is needed, which results in greatly increased circuit complexity and cost. Although the peak frequency can be determined with high accuracy using a low-performance processor, it takes a long time to calculate the peak frequency, and thus, it is impossible to detect a target within a sufficiently short time.

SUMMARY OF THE INVENTION

To overcome the above-described problems, preferred embodiments of the present invention provide radar device which detects a target with high accuracy by detecting a true peak frequency with high accuracy via a calculation which requires a greatly reduced amount of computation.

Preferred embodiments of the present invention provide a radar device for detecting a target from a peak frequency of a beat signal, including a transmission unit for transmitting a frequency-modulated transmission signal and generating a beat signal between a portion of the transmission signal and a signal reflected from the target, a signal processing unit for determining a discrete frequency spectrum for the beat signal multiplied by a window function and for determining the peak frequency of the beat signal from the discrete frequency spectrum, wherein the true peak frequency of the beat signal is determined by performing a process including the steps of fitting the frequency spectrum of the window function to the discrete frequency spectrum of the beat signal, determining the peak frequency of the window function fit to the discrete frequency spectrum of the beat signal, and using the peak frequency of the window function as the true peak frequency of the beat signal.

In the radar device according to preferred embodiments of the present invention, the true peak frequency of the beat signal is determined on the basis of an expression indicating $\Delta f$ as a function of signal strength at plural discrete frequencies in the discrete frequency spectrum, where $\Delta f$ is the frequency difference between the peak frequency of the frequency spectrum of the window function and the discrete peak frequency in the discrete frequency spectrum of the beat signal.

Furthermore, in the radar device according to preferred embodiments of the present invention, the function indicates the relationship between the frequency difference $\Delta f$ and the ratio $\Delta p$ between values of signal strength at two discrete frequencies of the plural discrete frequencies.

Furthermore, in the radar device according to preferred embodiments of the present invention, the two discrete frequencies are discrete frequencies in the discrete frequency spectrum, which are respectively higher and lower than the peak frequency and which are adjacent to the peak frequency in the discrete frequency spectrum.

Furthermore, in the radar device according to preferred embodiments of the present invention, the window function is preferably a function of a Hanning window, and the frequency difference Δf is determined on the basis of a linear function approximating the function indicating the relationship between the frequency difference Δf and the ratio Δp in logarithm between the values of signal strength at the two discrete frequencies.

In the radar device according to preferred embodiments of the present invention, the true peak frequency of the beat signal is determined by performing a process including the steps of fitting the frequency spectrum of the window function to the discrete frequency spectrum of the beat signal, determining the peak frequency of the window function fit to the discrete frequency spectrum of the beat signal, and using the peak frequency of the window function as the true peak frequency of the beat signal. Thus, the true peak frequency of the beat signal with a higher frequency resolution than the frequency resolution of the discrete frequency spectrum of the beat signal is easily determined.

Furthermore, in the radar device according to preferred embodiments of the present invention, an expression indicating Δf as a function of signal strength at plural discrete frequencies in the discrete frequency spectrum is determined in advance, where Δf denotes the frequency difference between the peak frequency of the frequency spectrum of the window function and the discrete peak frequency in the discrete frequency spectrum of the beat signal, and the true peak frequency of the beat signal is easily determined via a simple calculation using the function.

Furthermore, in the radar device according to preferred embodiments of the present invention, by using the function indicating the relationship between the frequency difference Δf and the ratio between values of signal strength at two discrete frequencies of the plural discrete frequencies, it is possible to determine the true peak frequency of the beat signal via a calculation which requires a greatly reduced amount of computation.

Furthermore, in the radar device according to preferred embodiments of the present invention, if discrete frequencies in the discrete frequency spectrum, which are respectively higher and lower than the peak frequency and which are adjacent to the peak frequency in the discrete frequency spectrum, are used as the two discrete frequencies described above, the frequency difference Δf is very sensitive to changes in the ratio Δp between the values of signal strength at the two discrete frequencies, and thus, the true peak frequency of the beat signal is determined with higher accuracy via a simple calculation.

Furthermore, in the radar device according to preferred embodiments of the present invention, when a Hanning window is used as the window function, and the relationship between the frequency difference Δf and the signal strength ratio Δp is approximated by a linear function, and the true peak frequency of the beat signal is determined via a further simplified calculation.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
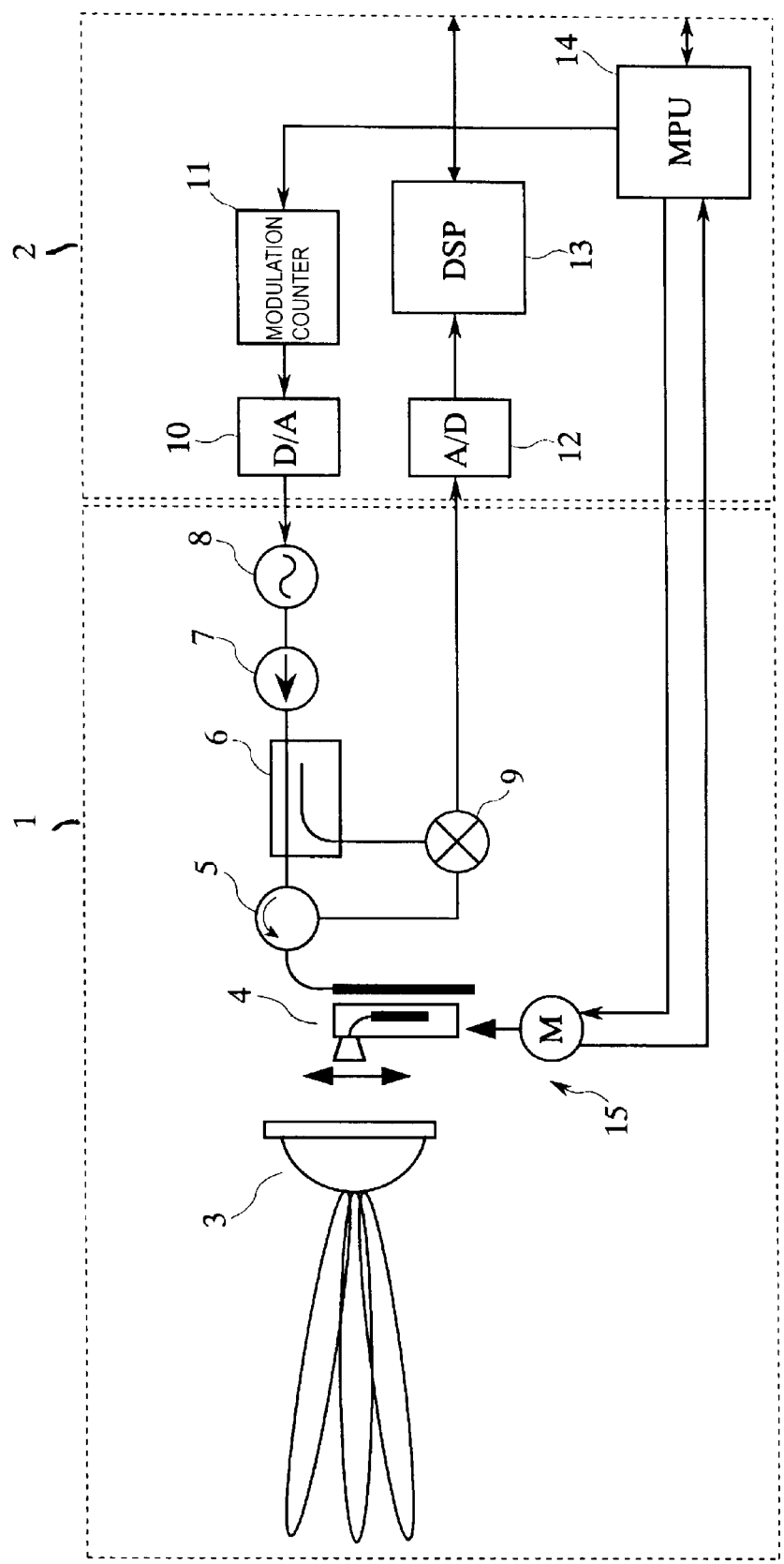
FIG. 1 is a block diagram showing a first preferred embodiment of a radar device according to the present invention.
Figure 2A:
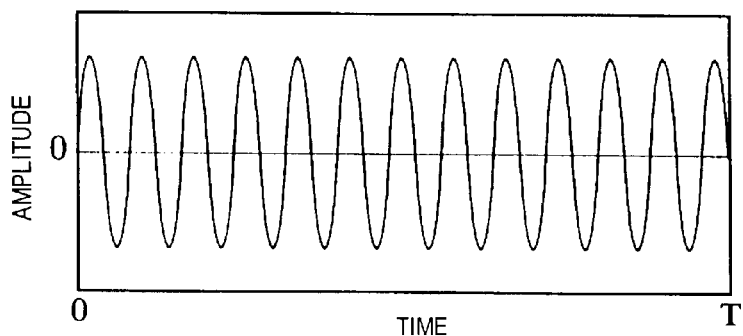
FIGS. 2A to 2D are diagrams showing a process, performed in the radar device, to determine a peak frequency of a beat signal.
Figure 2B:
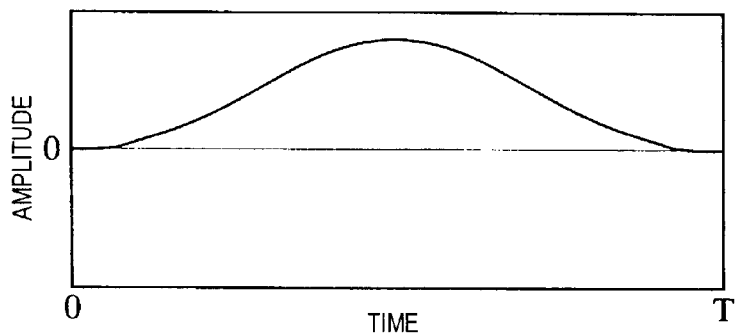
Figure 2C:
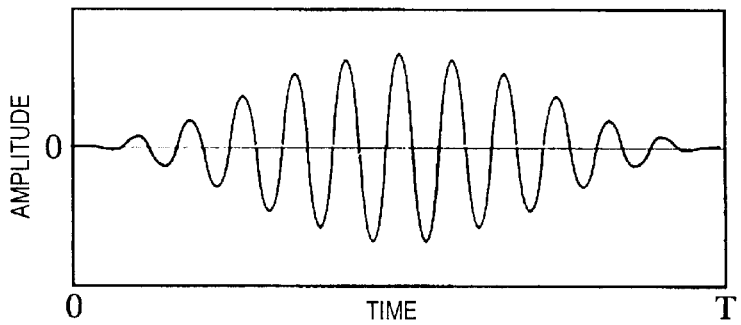
Figure 2D:
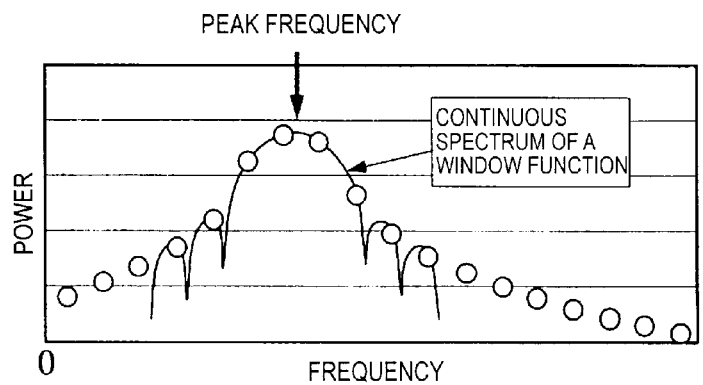
Figure 3:
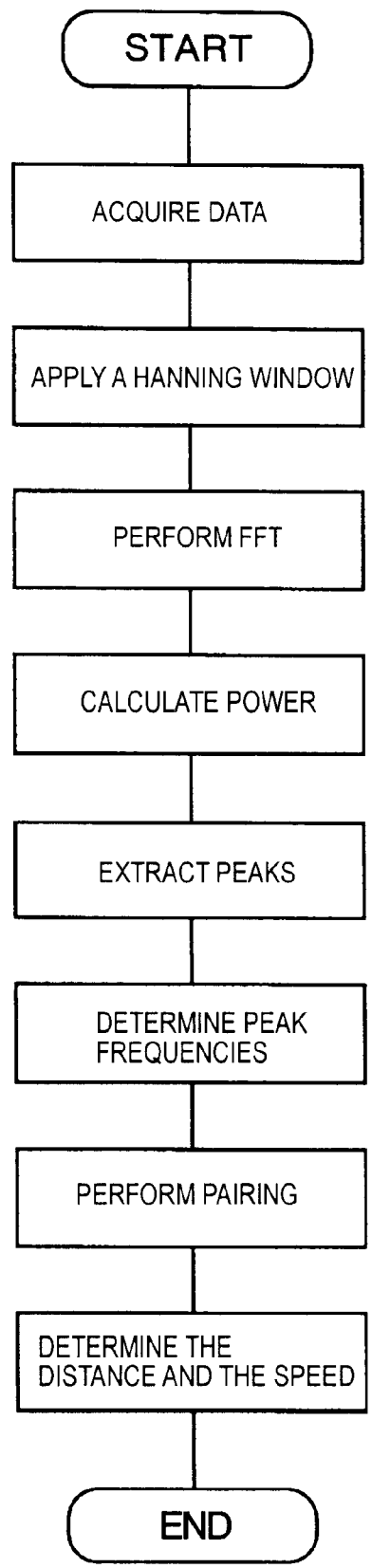
FIG. 3 is a flow chart showing the entire process performed in the radar device.

Referring to FIGS. 1 to 3, a first preferred embodiment of a radar device according to the present invention is described below.

FIG. 1 is a block diagram showing the construction of the radar device. In FIG. 1, reference numeral 1 denotes an RF block, and reference numeral 2 denotes a signal processing block. The RF block 1 transmits and receives radio waves for detecting a target via radar. A beat signal between transmitted and received radio waves is output from the RF block 1 and supplied to the signal processing block 2. A modulation counter 11 in the signal processing block 2 converts a count value into a triangular-shaped signal via a microprocessor 14. A digital-to-analog converter 10 converts the value output from the modulation counter 11 into an analog signal and outputs the resultant analog signal to a VCO 8 in the RF block 1. The VCO 8 generates an oscillation signal frequency-modulated in accordance with the triangular-shaped signal received from the modulation counter 11.

The oscillation signal output from the VCO 8 is supplied to a primary radiator 4 via an isolator 7, a coupler 6, and a circulator 5. The primary radiator 4 is located within or in the vicinity of the focal plane a dielectric lens 3. A millimeter wave signal radiated from the primary radiator 4 is focused into a narrow beam via the dielectric lens 3 and transmitted therefrom. If a reflected radio wave from a target such as a car is received by the primary radiator 4 via the dielectric lens 3, the received signal is transferred to a mixer 9 via the circulator 5. In addition to this received signal, a portion of the transmission signal is also applied, as a local signal, to the mixer 9 via the coupler 6. A beat signal having a frequency equal to the difference between the frequency of the received signal and the frequency of the local signal is output as an intermediate-frequency signal from the mixer 9 and applied to an analog-to-digital converter 12 in the signal processing block 2. The analog-to-digital converter 12 converts the received intermediate-frequency signal into digital data. A DSP (Digital Signal Processor) 13 determines a frequency spectrum of the beat signal by performing an FFT (Fast Fourier Transform) on a sequence of data received from the analog-to-digital converter 12.

The RF block 1 includes a scan unit 15 for moving the primary radiator 4 within a focal plane of the dielectric lens 3 or within a plane parallel to the focal plane of the dielectric lens 3. The moving portion and the fixed portion of the primary radiator 4 form a 0-dB coupler. The primary radiator 4 is moved by a driving motor M which is controlled by the microprocessor 14 thereby scanning the beam.

FIGS. 2A to 2D show a signal processing procedure performed on the sequence of data input from the analog-to-digital converter 12. FIG. 2A shows a data sequence, in the form of time-varying waveform, input from the analog-to-digital converter 12. The data sequence shown in FIG. 2A is multiplied by a particular window function such as that shown in FIG. 2B. As a result, a sequence of a particular number of data (for example, 1024 data) is obtained as shown in FIG. 2C. The resultant sequence of data obtained via the multiplication of the window function is then subjected to an FFT process thereby determining a discrete frequency spectrum as shown in FIG. 2D.

In FIG. 2D, open circles represent the signal strength (power) at respective discrete frequencies, and a solid line represents the continuous spectrum of the window function shown in FIG. 2B. When the continuous spectrum of the window function is fit or superimposed to the discrete frequency spectrum of the beat signal multiplied by the window functions, the peak frequency of the continuous spectrum of the window function corresponds to the true peak frequency of the beat signal. Therefore, the true peak frequency of the beat signal is determined by fitting or superposing the continuous spectrum of the window function to the discrete frequency spectrum of the beat signal multiplied by the window function, and then the center frequency (the peak frequency) of the continuous spectrum of the window function is the peak frequency of the beat signal to be obtained.

FIG. 3 is a flow chart showing the process performed by the DSP 13. First, data is acquired from the analog-to-digital converter 12. The data is then multiplied by weighting factors of a Hanning window and the result is subjected to an FFT process. A power spectrum is determined by calculating the logarithm of the sum of the square of the real part and the square of the imaginary part at each discrete frequency (hereafter, such a power spectrum will be referred to simply as a discrete frequency spectrum).

Thereafter, peaks in the discrete frequency spectrum are detected, and the frequency spectrum of the window function is fitted or superimposed to each peak thereby determining the true peak frequency of each peak. Because the fitting is performed by a computation, the frequency spectrum of the windows must be used as discrete spectrum data. For the above purpose, discrete spectrum data of the window function with frequency resolution sufficiently greater than the frequency resolution of the discrete frequency spectrum of the beat signal is prepared in advance. The degree of similarity between the spectrum of the window function and the discrete frequency spectrum of the beat signal is calculated while gradually shifting the spectrum of the window function along the frequency axis within a particular range centered at the peak until a best fit position is determined. Thus, the peak frequency of the beat signal with a high frequency resolution corresponding to the frequency resolution of the spectrum of the window function is determined.

The above-described process is performed sequentially for both the up-modulating interval and the down-modulating interval of the transmission frequency. The peak frequency of a peak in the spectrum detected in the up-modulating interval and the peak frequency of a corresponding peak, originating from the same target from which the peak detected in the up-modulating interval originates, detected in the down-modulating interval are paired. The pairing is performed for each target. The relative distance and the relative speed of each target are then calculated from the paired peak frequencies.

A device in the radar for determining the peak frequency of the beat signal, according to a second preferred embodiment of the present invention, is described below.

Figure 4:
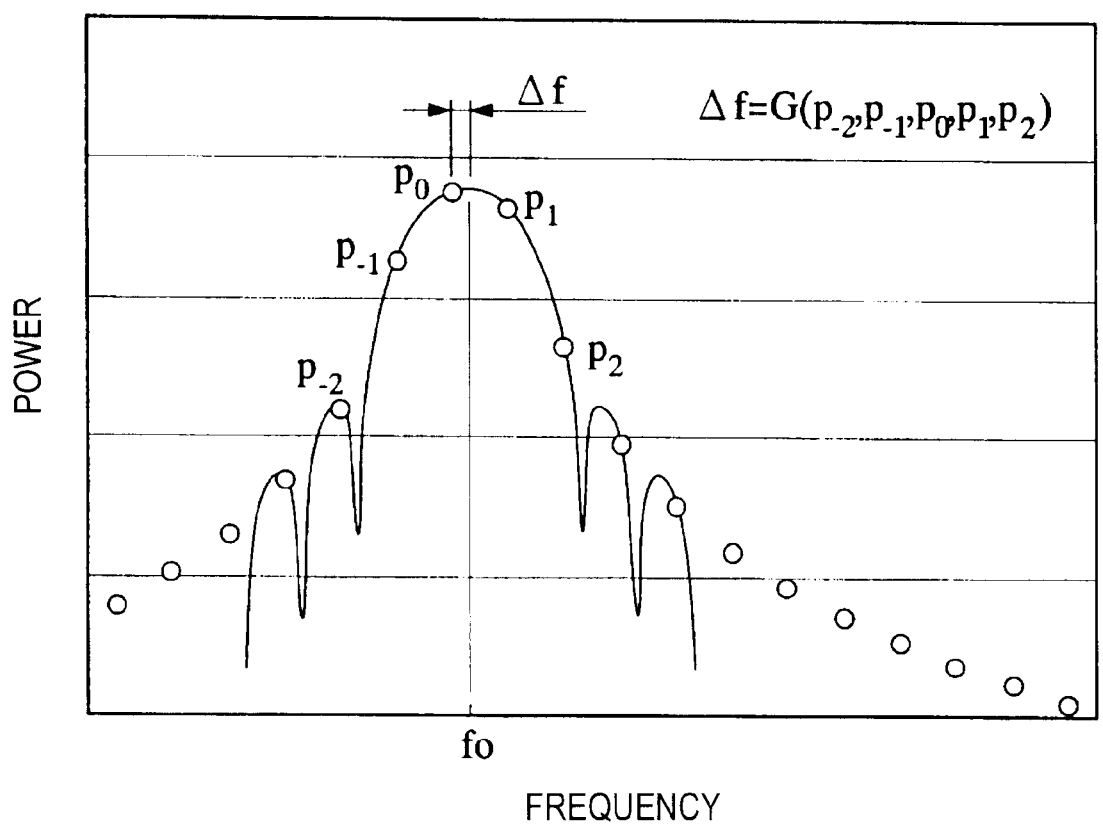
FIG. 4 is a diagram showing a process for determining the peak frequency of a beat signal, in the radar device, in accordance with a second preferred embodiment of the present invention.

FIG. 4 shows a discrete frequency spectrum of a beat signal multiplied by a window function and also shows a continuous frequency spectrum of the window function fit to the discrete frequency spectrum of the beat signal multiplied by the window function. In this example, the peak frequency of the window function is determined from the values of signal strength (power) $P_{-2}$, $P_{-1}$, $P_0$, $P_1$, and $P_2$ at respective five discrete frequencies in a range in the frequency axis centered at the peak frequency of the discrete frequency of the beat signal. To this end, the relationship between the difference between the peak frequency of the discrete frequency spectrum (the frequency of $P_0$) and the peak frequency fo of the window function is determined in advance as a function of the values of the signal strength $P_{-2}$, $P_{-1}$, $P_0$, $P_1$, and $P_2$ at the respective five discrete frequencies. That is, a function $G(P_{-2}, P_{-1}, P_0, P_1,$ and $P_2)$ which indicates the frequency difference $\Delta f$ described above is determined in advance ($\Delta f = G(P_{-2}, P_{-1}, P_0, P_1,$ and $P_2)$). By substituting the values of signal strength $P_{-2}$, $P_{-1}$, $P_0$, $P_1$, and $P_2$ at the respective five discrete frequencies obtained via the FFT process into the above function G, $\Delta f$ is determined.

Because the discrete peak frequency (the frequency of Po) is determined from the discrete frequency spectrum, the true peak frequency fo of the beat signal is determined from the discrete peak frequency and the frequency difference $\Delta f$.

A device in the radar for determining the peak frequency of a beat signal, according to a third preferred embodiment, is described below with reference to FIG. 5.

Figure 5:
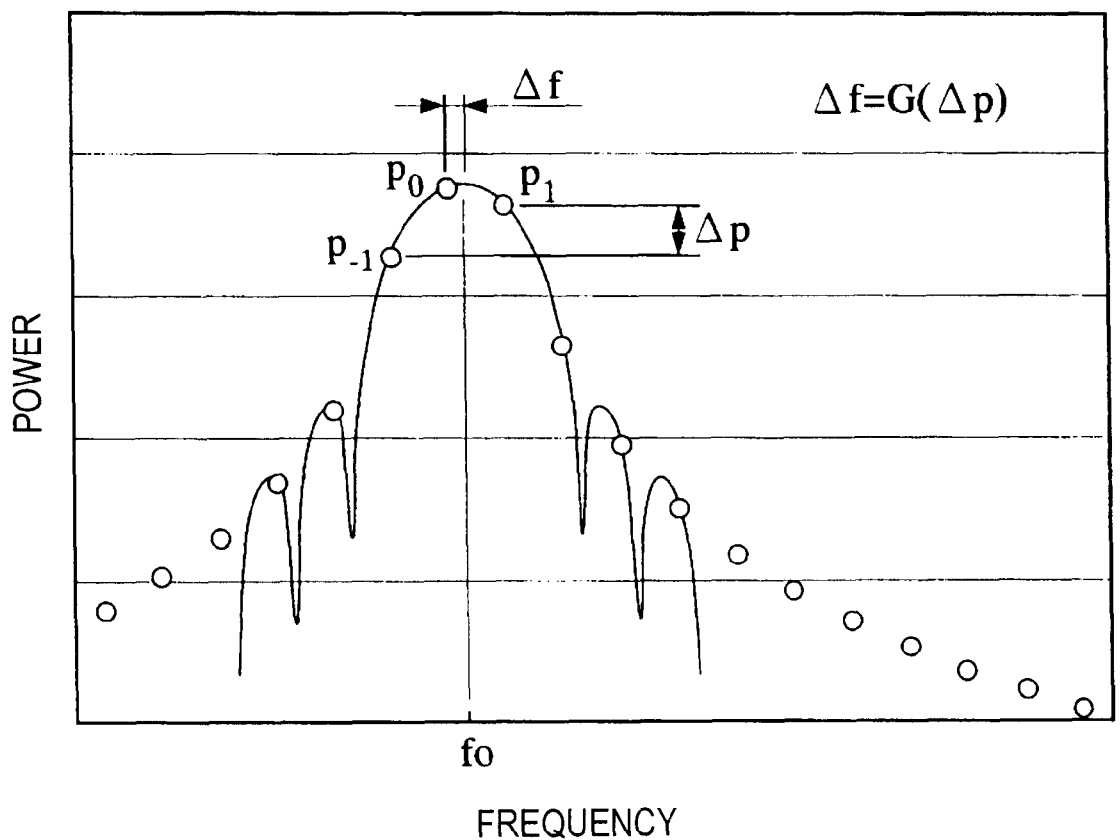
FIG. 5 is a diagram showing a process for determining the peak frequency of a beat signal, in the radar device, in accordance with a third preferred embodiment of the present invention.

FIG. 5 shows a discrete frequency spectrum of a beat signal multiplied by a window function and also shows a continuous frequency spectrum of the window function fit to the discrete frequency spectrum of the beat signal. In this example, the frequency difference $\Delta f$ is determined from the ratio $\Delta p$ between the values of signal strength $P_{-1}$ and $P_1$ at lower and higher discrete frequencies adjacent to the discrete peak frequency (the frequency of Po). Note that $\Delta p$ represented in logarithm corresponds to the difference between power $P_{-1}$ and power $P_1$ represented in logarithm.

A function, which indicates the relationship between the frequency difference $\Delta f$ and the ratio $\Delta p$ between the values of signal strength at higher and lower frequencies adjacent to the peak frequency of the beat signal, is determined in advance, and the frequency difference $\Delta f$ is determined by applying a measured value of $\Delta p$ to the function. Thus, the true peak frequency of the beat signal is determined from only two values of signal strength at discrete frequencies.

Figure 6:
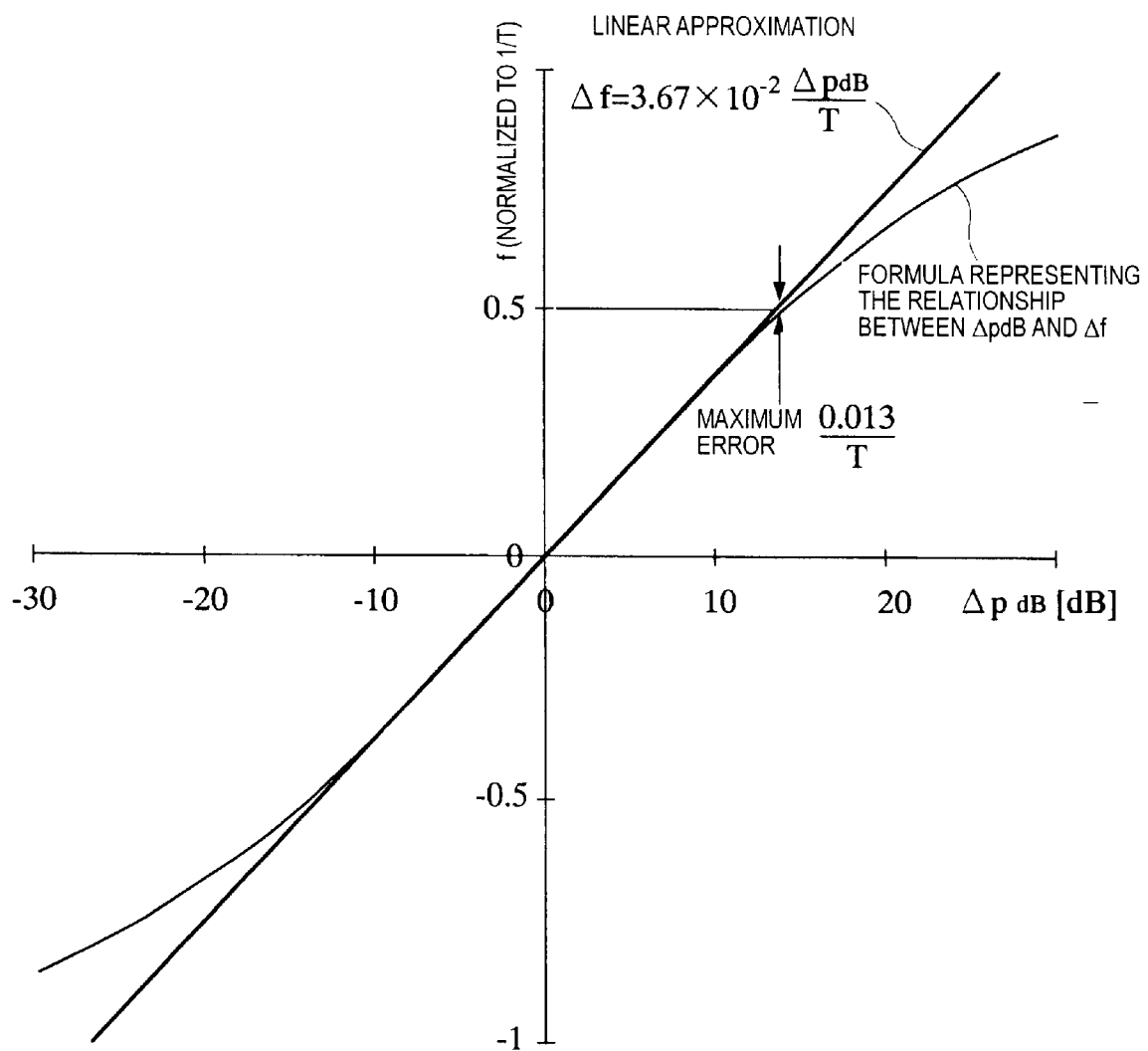
FIG. 6 is a graph showing the relationship between the frequency difference Δf and the signal strength ratio Δp, in the radar device, in accordance with a fourth preferred embodiment of the present invention.

A device in the radar for determining the peak frequency of a beat signal, according to a fourth preferred embodiment, is described below with reference to FIGS. 6 and 7.

In this preferred embodiment, a Hanning window is preferably used as the window function. The Hanning window is given by the following equation:

$$h(t) = \frac{1}{2} - \frac{1}{2}\cos\frac{2\pi t}{T}, \quad 0 \le t \le T \qquad (1)$$

where T denotes the sampling interval.

The Fourier transformation H(f) of the Hanning window is given by the following equation:

$$H(f) = \int_0^T h(t)e^{-j2\pi ft}dt \qquad (2)$$

$$= \frac{1}{2}Q(f) - \frac{1}{4}\left[Q\left(f + \frac{1}{T}\right) + Q\left(f - \frac{1}{T}\right)\right]$$

where $$Q(f) = \frac{\sin(2\pi Tf) + j[\cos(2\pi Tf) - 1]}{2\pi f} \qquad (3)$$

Because the frequency interval of the discrete frequency spectrum is equal to $1/T$, $P_1$ and $P_{-1}$ are given by the following equation:

$$P_1 = H\left(\frac{1}{T} - \Delta f\right) \qquad (4)$$

$$P_{-1} = H\left(-\frac{1}{T} - \Delta f\right)$$

Thus, $\Delta p$ is given by the following equation:

$$\Delta P = \frac{P_1}{P_{-1}} = \frac{H\left(\frac{1}{T} - \Delta f\right)}{H\left(-\frac{1}{T} - \Delta f\right)} \qquad (5)$$

$$= \frac{\frac{1}{2}Q\left(\frac{1}{T} - \Delta f\right) - \frac{1}{4}\left[Q\left(\frac{2}{T} - \Delta f\right) + Q(-\Delta f)\right]}{\frac{1}{2}Q\left(-\frac{1}{T} - \Delta f\right) - \frac{1}{4}\left[Q(-\Delta f) + Q\left(\frac{2}{T} - \Delta f\right)\right]}$$

$$= \frac{2Q\left(\frac{1}{T} - \Delta f\right) - Q\left(\frac{2}{T} - \Delta f\right) - Q(-\Delta f)}{2Q\left(-\frac{1}{T} - \Delta f\right) - Q(-\Delta f) - Q\left(-\frac{2}{T} - \Delta f\right)}$$

On the other hand, the following equation is obtained from equation (3).

$$Q\left(\frac{n}{T} + f\right) = Q(f)\frac{f}{\frac{n}{T} + f} \qquad (6)$$

where n denotes an arbitrary integer.

Taking into account equation (6), equation (5) can be rewritten as follows:

$$\Delta P = \frac{2Q(-\Delta f)\frac{-\Delta f}{\frac{1}{T} - \Delta f} - Q(-\Delta f)\frac{-\Delta f}{\frac{2}{T} - \Delta f} - Q(-\Delta f)}{2Q(-\Delta f)\frac{-\Delta f}{-\frac{1}{T} - \Delta f} - Q(-\Delta f) - Q(-\Delta f)\frac{-\Delta f}{-\frac{2}{T} - \Delta f}} \qquad (7)$$

By dividing the denominator and the numerator on the right side of equation (7) by $Q(-\Delta f)$, the following equation is obtained.

$$\Delta P = \frac{\frac{-2\Delta f}{\frac{1}{T} - \Delta f} - \frac{-\Delta f}{\frac{2}{T} - \Delta f} - 1}{\frac{-2\Delta f}{-\frac{1}{T} - \Delta f} - 1 - \frac{-\Delta f}{-\frac{2}{T} - \Delta f}} \qquad (8)$$

$$= \frac{\left(\frac{1}{T} + \Delta f\right)\left(\frac{2}{T} + \Delta f\right)}{\left(\frac{1}{T} - \Delta f\right)\left(\frac{2}{T} - \Delta f\right)}$$

Equation (8) indicates the relationship between $\Delta p$ and $\Delta f$. In the case in which the signal strength (power) of the frequency spectrum is represented in logarithm, equation (8) is modified as follows:

$$\Delta P_{dB} = 20\log(\Delta P) = 20\log\left[\frac{\left(\frac{1}{T} + \Delta f\right)\left(\frac{2}{T} + \Delta f\right)}{\left(\frac{1}{T} - \Delta f\right)\left(\frac{2}{T} - \Delta f\right)}\right] \qquad (9)$$

where $\Delta p_{dB}$ denotes the value in logarithm of $\Delta p$. FIG. 6 is a graph of equation (9). If $\Delta f$ is outside of a range from about $-0.5$ to about $+0.5$, the corresponding peak frequency must be that of an adjacent peak in the discrete frequency spectrum, and thus it is necessary to predetermine the relationship between $\Delta p$ and $\Delta f$ only for the range of $\Delta f$ from about $-0.5$ to about $+0.5$. In this range, as can be seen from FIG. 6, the relationship is regarded as being linear, and thus $\Delta f$ can be determined from $\Delta p$ via linear approximation given by the following equation:

$$\Delta f = 3.67 \times 10^{-2}\frac{\Delta P_{dB}}{T} \qquad (10)$$

The maximum error caused by the approximation is about $0.013/T$ for $\Delta f$ in the range of $\pm 1/(2T)$. Therefore, equation (10) can be used to determine $\Delta f$ with a sufficiently high frequency resolution relative to the frequency accuracy of $\pm 0.23/T$ (corresponding to a speed resolution of $\pm 1$ km/h) required in radar.

Figure 7:
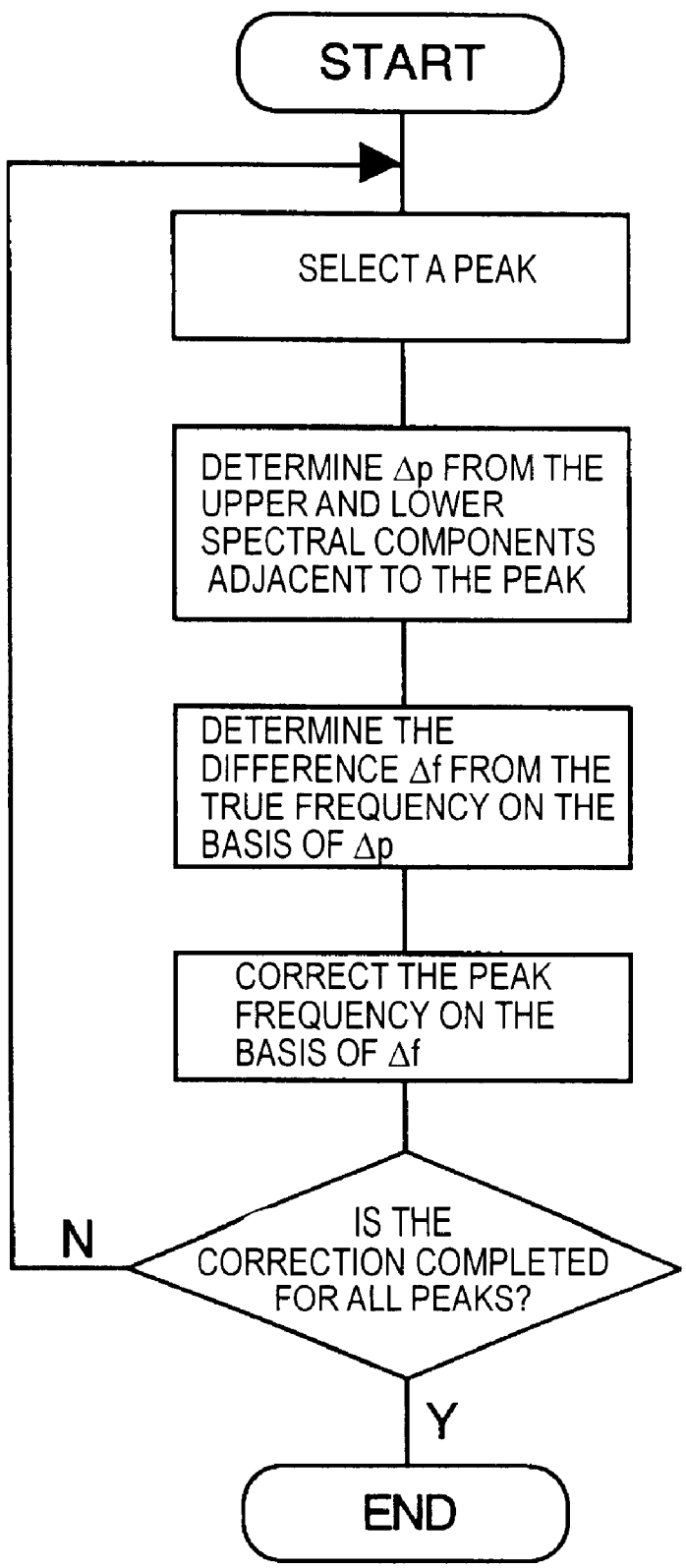
FIG. 7 is a flow chart showing a process of determining the peak frequency of a beat signal, in the radar device in accordance with a fourth preferred embodiment of the present invention.
Figure 8A:
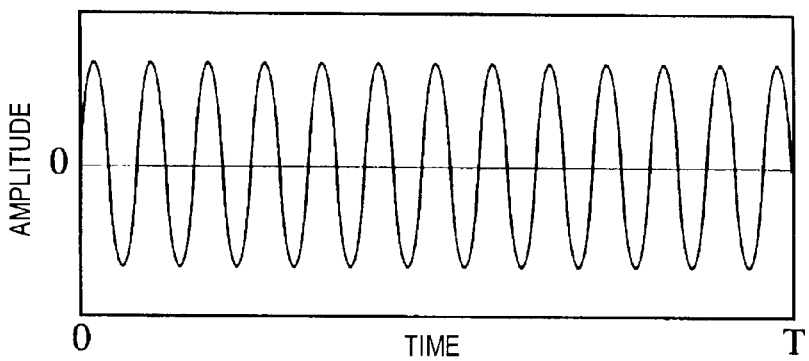
FIGS. 8A–8C show a process of determining the peak frequency of a beat signal, in a radar device according to a conventional technique.
Figure 8B:
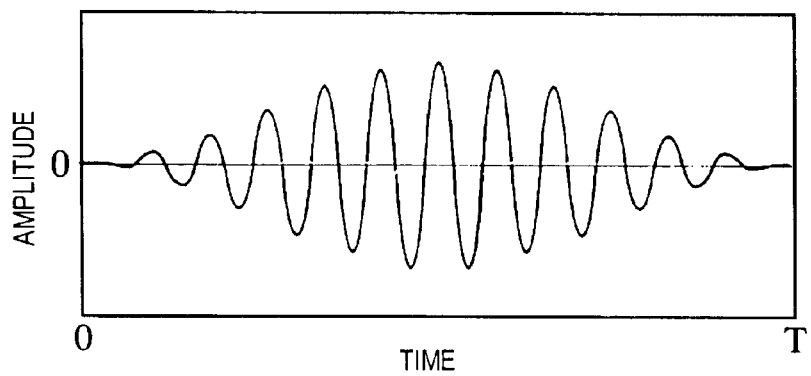
Figure 8C:
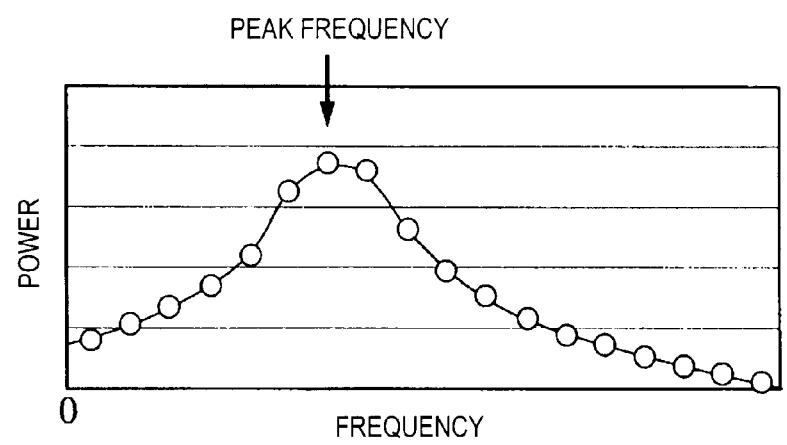
Figure 9A:
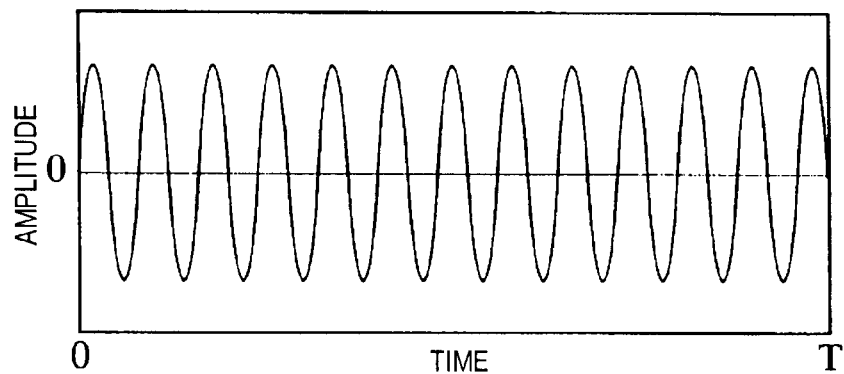
FIGS. 9A–9C show a conventional technique of determining the peak frequency of a beat signal, with a high resolution.
Figure 9B:
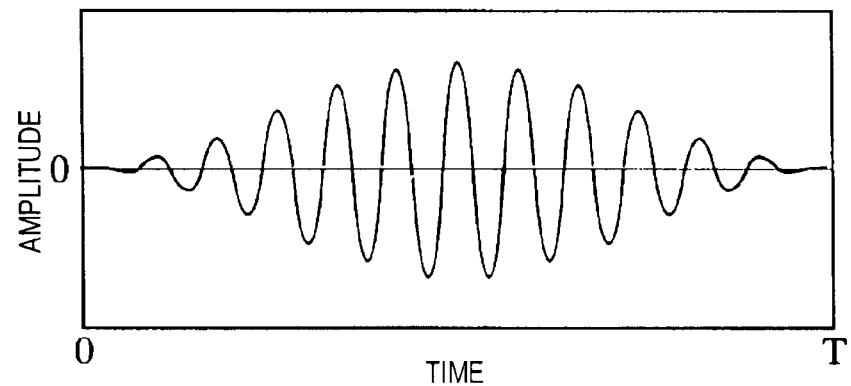
Figure 9C:
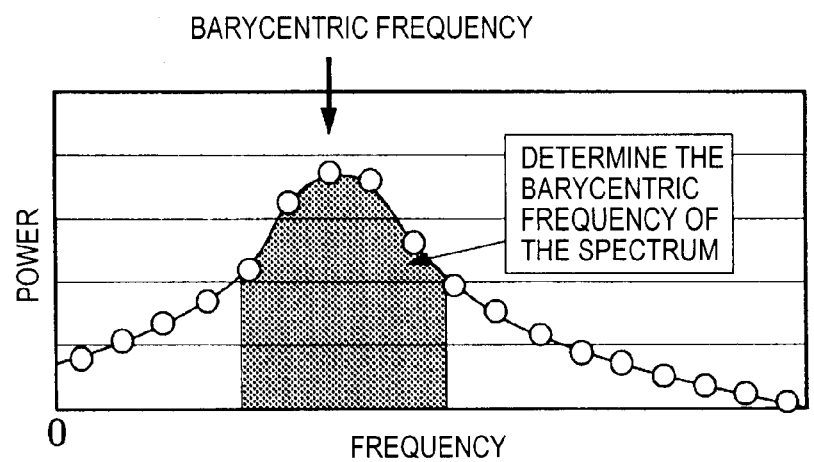
Figure 10A:
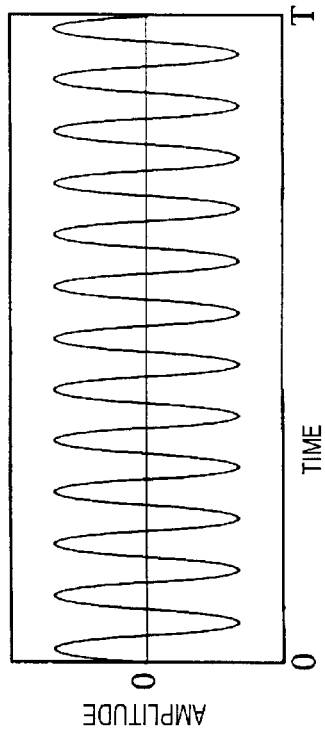
FIGS. 10A–10C is a diagram showing another conventional technique of determining the peak frequency of a beat signal, with a high resolution.
Figure 10B:
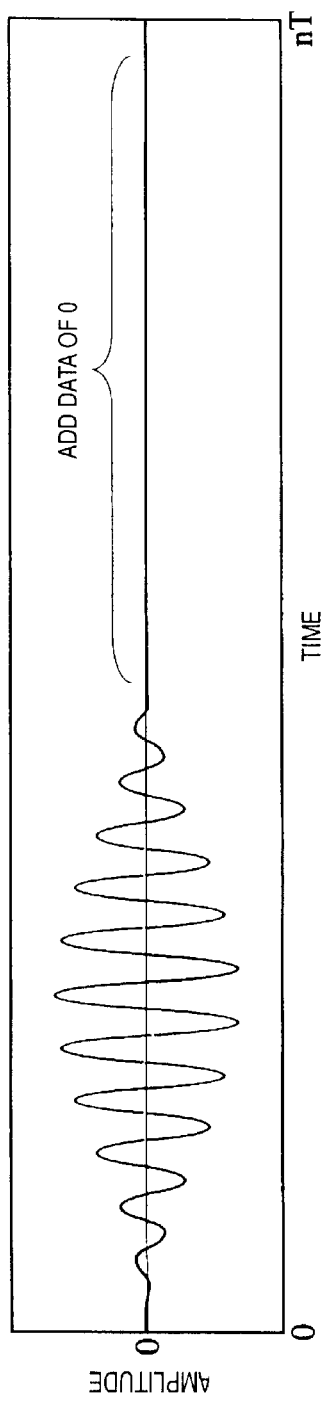
Figure 10C:
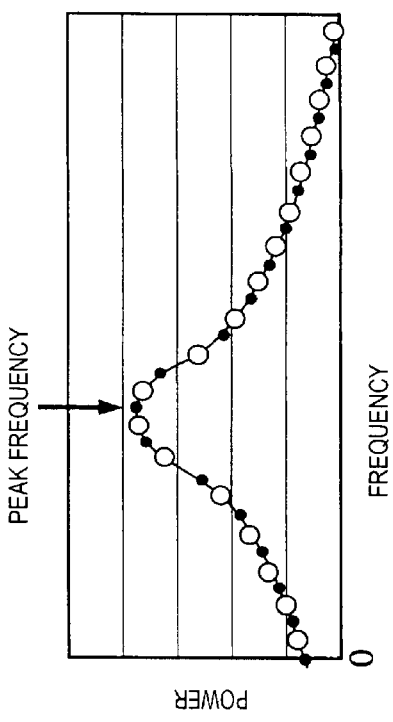

FIG. 7 is a flow chart showing a process for detecting the peak frequency of a beat signal. First, a discrete peak frequency is selected from the discrete frequency spectrum components. $\Delta p$ is then determined from the values of signal strength at higher and lower discrete frequencies adjacent to the selected discrete peak frequency. Thereafter, the frequency difference $\Delta f$ is determined from $\Delta p$ via linear approximation as described above. The true peak frequency is then determined from $\Delta f$ and the discrete peak frequency.

In a case in which there are plural targets, plural peaks appear in the discrete frequency spectrum of the beat signal. Thus, in this case, the process described above is performed for each peak appearing in the discrete frequency spectrum of the beat signal.

In the example shown in FIG. 5, Δf is determined from the values of signal strength at higher and lower discrete frequencies adjacent to a peak frequency in the discrete frequency spectrum of a beat signal. Alternatively, for example, Δf may be determined from the signal strength at a peak frequency in the discrete frequency spectrum of a beat signal and the signal strength at a lower or higher discrete frequency adjacent to the peak frequency. More specifically, the relationship between the frequency difference Δf and the two discrete frequencies is determined in advance in the form of a function, and Δf is determined from the two values of signal strength by using the function.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A radar device for detecting a target from a peak frequency of a beat signal, comprising:
    an RF block for transmitting a frequency-modulated transmission signal and generating a beat signal between a portion of the transmission signal and a signal reflected from the target; and
    a signal processing block for determining a discrete frequency spectrum for the beat signal multiplied by a window function and for determining the peak frequency of the beat signal from the discrete frequency spectrum; wherein
        the signal processing block determines the true peak frequency of the beat signal by performing a process including the steps of fitting the frequency spectrum of the window function to the discrete frequency spectrum of the beat signal, determining the peak frequency of the window function fit to the discrete frequency spectrum of the beat signal, and using the peak frequency of the window function as the true peak frequency of the beat signal.

2. A radar device according to claim 1, wherein the window function indicates the relationship between a frequency difference Δf and a ratio Δp between values of signal strength at two discrete frequencies of a plurality of discrete frequencies.

3. A radar device according to claim 2, wherein said two discrete frequencies are discrete frequencies in the discrete frequency spectrum, which are, respectively, higher and lower than the peak frequency and which are adjacent to the peak frequency in the discrete frequency spectrum.

4. A radar device according to claim 3, wherein the window function is a function of a Hanning window, and the frequency difference Δf is determined on the basis of a linear function approximating the function indicating the relationship between the frequency difference Δf and the ratio Δp in logarithm between the values of signal strength at the two discrete frequencies.

5. A radar device according to claim 1, wherein said RF block includes a voltage controlled oscillator, a primary radiator and an isolator, said voltage controlled oscillator supplies an oscillation signal to said primary radiator via said isolator.

6. A radar device according to claim 5, wherein said RF block further includes a dielectric lens, said primary radiator being located within or in the vicinity of a focal plane of said dielectric lens, such that a millimeter wave signal radiated from the primary radiator is focused into a narrow beam via the dielectric lens.

7. A radar device according to claim 6, wherein said RF block further includes a mixer, a circulator and a coupler arranged such that said reflected signal is received by the primary radiator via the dielectric lens, the received reflected signal is transferred to the mixer via the circulator, and the portion of the transmission signal is transferred to the mixer to generate the beat signal.

8. A radar device according to claim 6, wherein said RF block further includes a scan unit for moving the primary radiator within a focal plane of the dielectric lens or within a plane that is substantially parallel to the focal plane of the dielectric lens.

9. A radar device according to claim 1, wherein the signal processing block includes a microprocessor and a modulation counter arranged such that a count value is converted into a triangular-shaped signal via the microprocessor.

10. A radar device according to claim 1, wherein the signal processing block includes a digital signal processor which determines the frequency spectrum of the beat signal by performing a Fast Fourier Transform.

11. A radar device for detecting a target from a peak frequency of a beat signal, comprising:
    an RF block for transmitting a frequency-modulated transmission signal and generating a beat signal between a portion of the transmission signal and a signal reflected from the target; and
    a signal processing block for determining a discrete frequency spectrum for the beat signal multiplied by a window function and for determining the peak frequency of the beat signal from the discrete frequency spectrum; wherein
        the signal processing block determines the true peak frequency of the beat signal on the basis of an expression indicating Δf as a function of signal strength at plural discrete frequencies in the discrete frequency spectrum, where Δf denotes the frequency difference between the peak frequency of the frequency spectrum of the window function and the discrete peak frequency in the discrete frequency spectrum of the beat signal.

12. A radar device according to claim 11, wherein said two discrete frequencies are discrete frequencies in the discrete frequency spectrum, which are, respectively, higher and lower than the peak frequency and which are adjacent to the peak frequency in the discrete frequency spectrum.

13. A radar device according to claim 12, wherein the window function is a function of a Hanning window, and the frequency difference Δf is determined on the basis of a linear function approximating the function indicating the relationship between the frequency difference Δf and the ratio Δp in logarithm between the values of signal strength at the two discrete frequencies.

14. A radar device according to claim 11, wherein said RF block includes a voltage controlled oscillator, a primary radiator and an isolator, said voltage controlled oscillator supplies an oscillation signal to said primary radiator via said isolator.

15. A radar device according to claim 14, wherein said RF block further includes a dielectric lens, said primary radiator being located in or in the vicinity of a focal plane of said dielectric lens, such that a millimeter wave signal radiated from the primary radiator is focused into a narrow beam via the dielectric lens.

16. A radar device according to claim 15, wherein said RF block further includes a mixer, a circulator and a coupler arranged such that said reflected signal is received by the primary radiator via the dielectric lens, the received reflected signal is transferred to the mixer via the circulator, and the portion of the transmission signal is transferred to the mixer to generate the beat signal.

17. A radar device according to claim 15, wherein said RF block further includes a scan unit for moving the primary radiator within a focal plane of the dielectric lens or within a plane that is substantially parallel to the focal plane of the dielectric lens.

18. A radar device according to claim 11, wherein the signal processing block includes a microprocessor and a modulation counter arranged such that a count value is converted into a triangular-shaped signal via the microprocessor.

19. A radar device according to claim 11, wherein the signal processing block includes a digital signal processor which determines the frequency spectrum of the beat signal by performing a Fast Fourier Transform.

* * * * *